United States Patent [19]
DeBoer et al.

[11] Patent Number: 5,989,338
[45] Date of Patent: Nov. 23, 1999

[54] METHOD FOR DEPOSITING CELL NITRIDE WITH IMPROVED STEP COVERAGE USING MOCVD IN A WAFER DEPOSITION SYSTEM

[75] Inventors: Scott J. DeBoer; Randhir P. S. Thakur, both of Boise, Id.

[73] Assignee: Micron Technology, Inc., Boise, Id.

[21] Appl. No.: 08/561,735

[22] Filed: Nov. 22, 1995

[51] Int. Cl.$^6$ .................................................. C30B 25/04
[52] U.S. Cl. .................... 117/84; 117/952; 427/255.1; 427/255; 427/248.1
[58] Field of Search .................. 117/84, 952; 427/255.1, 427/255, 248.1

[56] References Cited

U.S. PATENT DOCUMENTS

| | | | |
|---|---|---|---|
| 4,312,921 | 1/1982 | Hirai et al. | 117/952 |
| 4,863,755 | 9/1989 | Hess et al. | 427/39 |
| 4,992,299 | 2/1991 | Hochberg et al. | 427/38 |
| 5,322,913 | 6/1994 | Blum et al. | 528/15 |

OTHER PUBLICATIONS

Arthur K. Hochberg et al, "Diethylsilane as a Silicon Source for the Deposition of Silicon Nitride and Silicon Oxynitride Films by LPCVD", 1991 Materials Research Society, pp. 509–513.

Yoshihiki Kusakabe et al, "Conformal Deposition on a Deep–Trenched Substrate by MOCVD", 1993 Applied Surface Science, pp. 763–767.

Frieser, "Direct Nitridation of Silicon Substrates", J. Electrochemical Society: Solid State Science, pp. 1092–1094, Oct. 1968.

Grow et al, "Plasma Enhanced Chemical Vapor Deposition of Silicon Nitride from Novel organosilanes", Mater. Res. Soc. Symp. Proc. abstract only, 1994.

*Primary Examiner*—Robert Kunemund

[57] ABSTRACT

An embodiment of the present invention teaches a method for forming a storage capacitor during semiconductor memory device fabrication, the method comprising the steps of: forming a first capacitor plate structure comprising a polysilicon material having an aspect ratio comprising a vertical component and a horizontal component; wherein the vertical component of the first capacitor plate structure is greater in dimension than the horizontal component of the first capacitor plate structure; depositing a silicon nitride layer over the first capacitor plate structure by exposing the first capacitor plate structure to a gas vapor phase of an organometallic precursor and to an nitrogen based gas in an Metal Organic Chemical Vapor Deposition (MOCVD) chamber; and forming a second capacitor plate structure over the silicon nitride layer, the second capacitor plate structure being positioned to span at least a portion of the first capacitor plate structure.

26 Claims, 4 Drawing Sheets

METHOD FOR DEPOSITING CELL NITRIDE WITH IMPROVED STEP COVERAGE USING MOCVD IN A WAFER DEPOSITION SYSTEM

FIELD OF THE INVENTION

This invention relates to semiconductor fabrication and particularly to a silicon nitride dielectric material and a process to create same.

BACKGROUND OF THE INVENTION

Dielectric materials used in semiconductors are selected depending on the intended use. For example, in the dynamic random access memory (DRAM) device, storage cells require a storage capacitor as a means of storing a charge to represent data. It is usually therefore desirable to select a dielectric material that possesses a high dielectric constant in order to prevent charge leakage. This is even more desirable as DRAM devices become more densely packed to contain more bit storage capability per die than early generations.

Many capacitor dielectrics have been utilized in attempts to shrink capacitor size and still maintain sufficient charge storage capability. Some examples include, thin film nitrides, oxide/nitride combinations or ferroelectric materials to name a few. However, each of these dielectric films possess limitations thus forcing ongoing research to find the ideal capacitive dielectric film The present invention develops a very promising capacitive dielectric film by using MOCVD techniques developed for the deposition of metals. These techniques will become apparent to one skilled in the art from the following disclosure.

SUMMARY OF THE INVENTION

One embodiment of the present invention comprises a method using Metal Organic Chemical Vapor Deposition (MOCVD) for forming a silicon nitride film during semiconductor device fabrication, the method comprising the step of:

exposing a structure residing inside an MOCVD chamber, to a gas vapor phase of an organometallic precursor and to a nitrogen based gas or a nitrogen gas vapor generated from a nitrogen based organometallic precursor, the structure having an aspect ratio comprising a vertical component and a horizontal component; wherein the vertical component of the structure is greater in dimension than the horizontal component of the structure.

Another embodiment of the present invention comprises a method for forming a dielectric film during semiconductor device fabrication, the method comprising the steps of:

providing a semiconductive substrate in a rapid thermal processing chamber, the semiconductive substrate comprising a structure having an aspect ratio comprising a vertical component and a horizontal component; wherein the vertical component of the structure is greater in dimension than the horizontal component of the structure;

forming a first nitride layer supported by the semiconductive substrate; and depositing a second nitride layer superjacent the first nitride layer inside an (MOCVD) chamber, by exposing the first nitride layer to a gas vapor phase of an organometallic precursor and to a nitrogen based gas.

Still another embodiment of the present invention is a method for forming a dielectric film during semiconductor device fabrication, the method comprising the steps of:

providing a silicon substrate in a rapid thermal processing chamber, the silicon substrate comprising a polysilicon material which forms a structure having an aspect ratio comprising a vertical component and a horizontal component; wherein the vertical component of the structure is greater in dimension than the horizontal component of the structure;

forming a first nitride layer superjacent the polysilicon material; and depositing a second nitride layer superjacent the first nitride layer inside an (MOCVD) chamber, by exposing the first nitride layer to a gas vapor phase of an organometallic precursor and to a nitrogen based gas.

Still another embodiment of the present invention is a method for forming a storage capacitor during semiconductor memory device fabrication, the method comprising the steps of:

forming a first capacitor plate structure comprising a polysilicon material having an aspect ratio comprising a vertical component and a horizontal component; wherein the vertical component of the first capacitor plate structure is greater in dimension than the horizontal component of the first capacitor plate structure;

depositing a silicon nitride layer over the first capacitor plate structure by exposing the first capacitor plate structure to a gas vapor phase of an organometallic precursor and to an nitrogen based gas or a nitrogen gas vapor generated from a nitrogen based precursor, in an Metal Organic Chemical Vapor Deposition (MOCVD) system; and forming a second capacitor plate structure over the silicon nitride layer, the second capacitor plate structure being positioned to span at least a portion of the first capacitor plate structure.

DETAILED DESCRIPTION OF THE INVENTION

Figure 1:
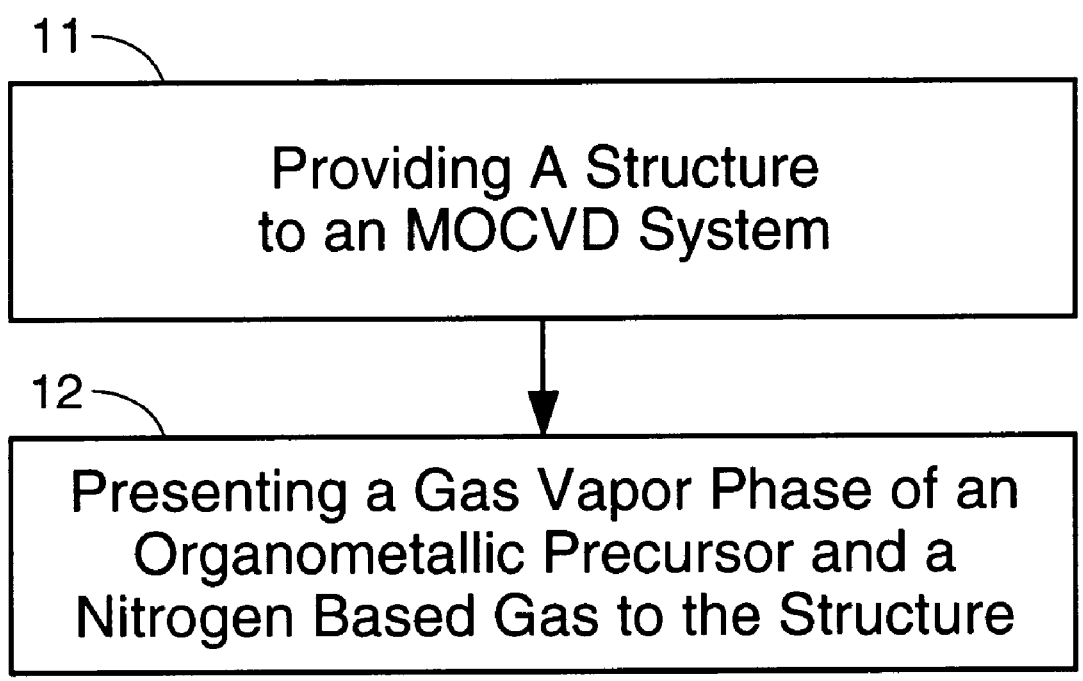
FIGS. 1 and 2 show process steps to form the dielectric material of the present invention.
Figure 2:
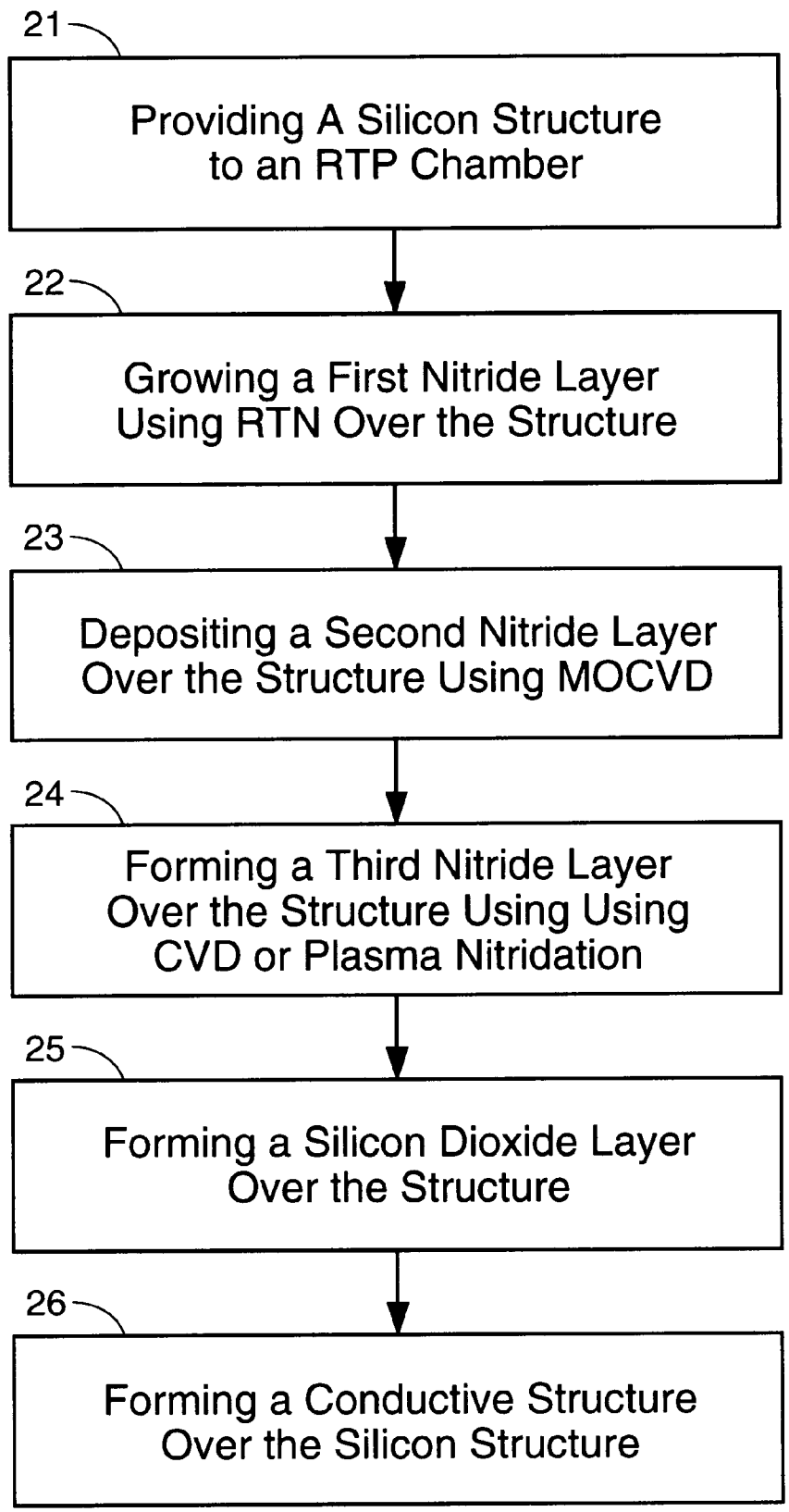
Figure 3:
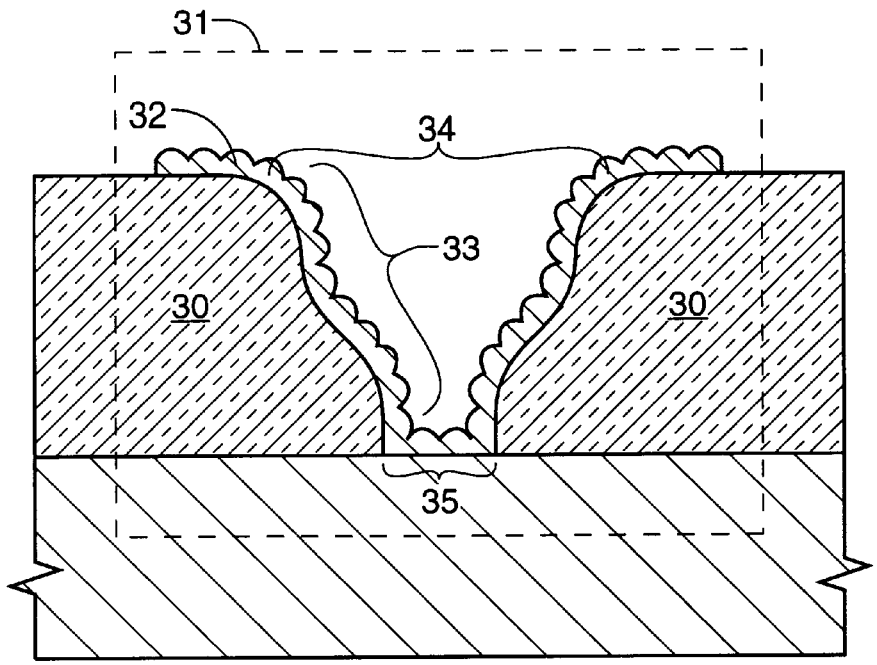
FIGS. 3–5 show the results of the process steps outlined in FIGS. 1 and 2 depicting specific implementations to form the dielectric material of the present invention.
Figure 4:
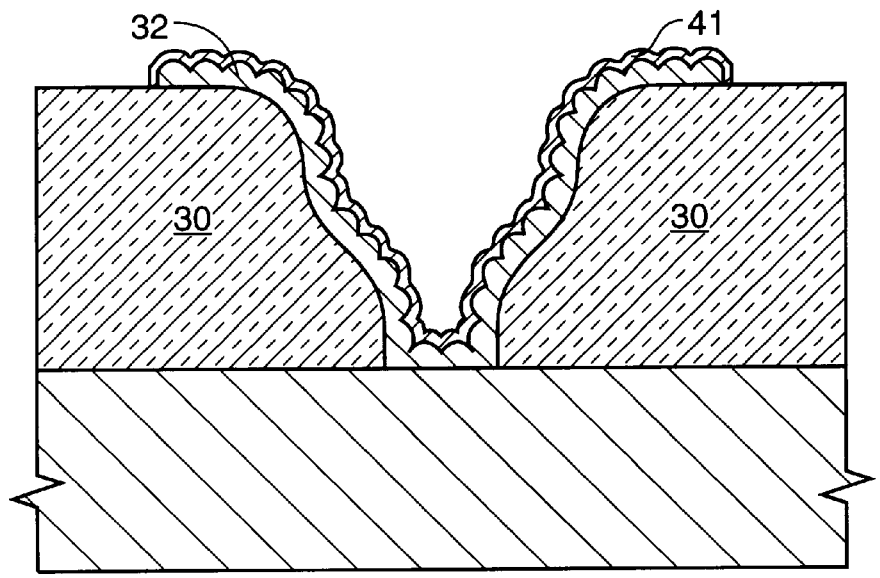
Figure 5:
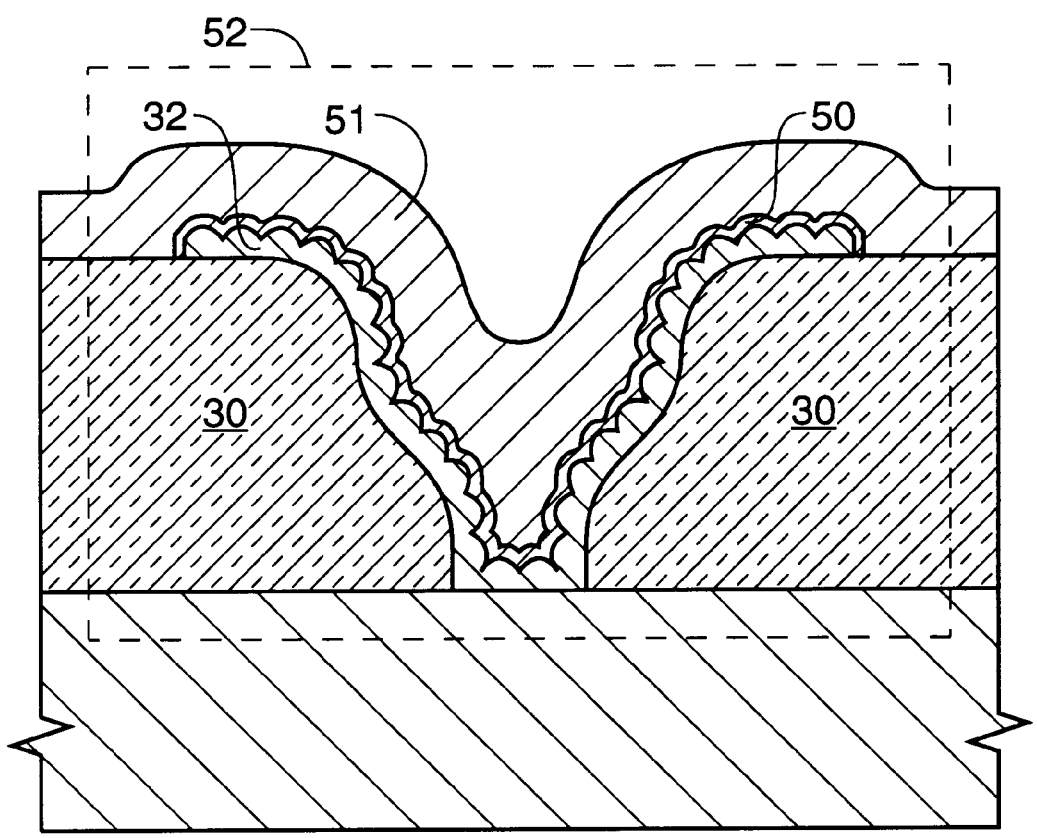

Embodiments of the present invention are depicted in the process flow charts of FIGS. 1 and 2. Results of the process steps of specific embodiments are depicted in FIGS. 3–5, as will be appreciated by one skilled in the art from the following descriptions of the invention.

Referring now to the process flow chart of FIG. 1, during step 11, a fabricated structure is provided to the chamber of an Metal Organic Chemical Vapor Deposition (MOCVD) system.

During step 12, the structure is exposed to gas vapor phase of an organometallic precursor and an nitrogen based gas which may also be generated from an nitrogen based organometallic precursor. The gas vapor phases of the organometallic precursors are obtained by bubbling inert gas, such as argon or helium, into the precursor to create a gas vapor of the precursor. It is preferred that the structure has an aspect ratio of at least 2:1 and range up to 10:1. It is also preferred that the ratio of the gas vapor phase of the organometallic precursor to the nitrogen based gas be at least 3:1. It is also preferred that the organometallic precursor used be diethylsilane and that the nitrogen based gas used be NH$_3$ or hydrazine or that the nitrogen be generated by bubbling an inert gas into a nitrogen based organometallic precursor.

The present invention provides an excellent dielectric particularly for structures having aspect ratios that range from 2:1 to 10:1. The thickness of the MOCVD nitride layer formed will be at least 20 Å and it is preferred that the thickness range from 40 Å to 70 Å or for thicker films an MOCVD silicon nitride layer having a thickness ranging from 700 Å to 2500 Å can be achieved. The MOCVD system used may be either a single wafer deposition system or a batch wafer deposition system.

Though the following method will deposit a nitride film on a substantially planar structure, it is a main intent of the present invention to provide a nitride film having excellent step coverage onto a three dimensional structure and in particular a three dimensional structure having a roughened silicon surface. One of the defining characteristic of a three dimensional structure which affects step coverage is the structure's corresponding aspect ratio (i.e. the height-to-spacing ratio of two adjacent steps or a vertical component of the structure compared to the horizontal component of the structure). FIG. 3 depicts a structure, enclosed by box 31 (and referred to hereinafter as simply structure 31), that is well suited to the present invention, as it is a three dimensional structure having an aspect ratio of at least 2:1. That is, as seen in FIG. 3, structure 31 has vertical wall dimension (or height) 33 that is at least twice its spacing dimension 34 (though it is only necessary that the vertical component be greater in dimension than the horizontal component. Even more critical is spacing dimension 35 where dimension 33 is at least three times spacing dimension 35. As one skilled in the art will appreciate, when dealing with structures having aspects ratios of this degree, forming a conformal dielectric film on the walls of the structure becomes a major challenge in order to maintain sufficient step coverage of the film, particularly at the comers which are susceptible to thinning and even cracking of the film.

Referring again to FIG. 3, structure 31 has been etched into substrate material 30. The walls of structure 31 is lined with roughened silicon 32, such as hemispherical grain silicon or texturized polysilicon. Again, the aspect ratio of structure 31 is defined by the vertical height dimension 33 compared to the spacing dimension 34 which in this case is at least 2:1 or when compared to the more critical spacing dimension 35 the aspect ratio is a least 3:1). The present invention may be performed on even a planar structure or even on a three dimensional structure where the device has an aspect ratio where the height of the device is greater in dimension than is the spacing of the device. However, in the present invention it is preferred that the structure have an aspect ratio of at least 2:1 and that the structure's surface is roughened surface as depicted in FIG. 3. In further light of the present invention, FIG. 3 may be considered as a cross-sectional view of a storage capacitor plate being formed during semiconductor memory device fabrication.

Continuing with the present invention when used to form a storage capacitor and referring now to FIG. 4, the roughened silicon 32 lining structure 31 is provided inside a Metal Organic Chemical Vapor Deposition (MOCVD) chamber and exposed to a gas vapor phase of an organometallic precursor and an nitrogen based gas to form an MOCVD nitride dielectric layer 41. MOCVD nitride dielectric layer 41 conforms to the surface of roughened silicon 32 to provide excellent step coverage of the dielectric film over structure 31. Though MOCVD was developed for deposition of metals, the present invention takes advantage of this deposition technique in order to deposit dielectric films that provide excellent step coverage as well. It is preferred that the ratio of the gas vapor phase of the organometallic precursor to the nitrogen based gas be at least 3:1. It is also preferred that the organometallic precursor used be diethylsilane and that the nitrogen based gas used be NH$_3$, hydrazine, or a nitrogen gas vapor generated from a nitrogen based organometallic precursor.

The present invention provides an excellent capacitive dielectric particularly for structures having aspect ratios that range from 2:1 to 10:1. The thickness of the MOCVD nitride layer formed will be at least 20 Å and it is preferred that the thickness range from 40 Å to 70 Å or for thicker films an MOCVD silicon nitride layer having a thickness ranging from 700 Å to 2500 Å can be achieved. The MOCVD system used may be either a single wafer deposition system or a batch wafer deposition system.

Figure 4A:
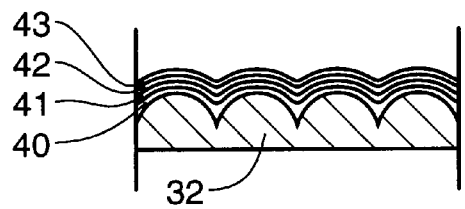

Another embodiment of the present invention is demonstrated by the flow chart of FIG. 2, which is further depicted in the cross-sectional views of FIGS. 3, 4, 4a and 5. In FIG. 2, during step 21 a silicon structure, such as a capacitor plate structure 31, lined with roughened silicon 32, of FIG. 3, is provided in a Rapid Thermal Processing (RTP) chamber. During step 22 a nitride layer 40 (also referred to as Rapid Thermal Nitridation (RTN) nitride 40) of FIG. 4a is formed superjacent polysilicon material 32. It is preferred that the RTN nitride 40 be formed during step 22 by introducing NH$_3$ into the RTP chamber while heating the processing chamber to a temperature of at least 1000° C. continuously for approximately 10 to 60 seconds, at a vacuum pressure range of 10$^{-10}$ Torr to atmospheric pressure.

During step 23, capacitor plate structure 31 lined with roughened silicon 32 and now coated with RTN nitride 40, is provided to a Metal Organic Chemical Vapor Deposition (MOCVD) chamber. Now a MOCVD nitride layer 41 is deposited superjacent RTN nitride layer 40 by exposing structure 31 to a gas vapor phase of an organometallic precursor and an nitrogen based gas. Again, it is preferred that the ratio of the gas vapor phase of the organometallic precursor to the nitrogen based gas be at least 3:1. It is also preferred that the organometallic precursor used be diethylsilane and that the nitrogen based gas used be NH$_3$, hydrazine, or a nitrogen gas vapor generated from a nitrogen based organometallic precursor.

Next, during step 24 a third nitride layer 42 is deposited superjacent MOCVD nitride layer 41 by either plasma nitridation or low pressure Chemical Vapor Deposition (now referred to as CVD nitride layer 42). Next during step 25, a silicon dioxide layer 43 is formed superjacent nitride layer 42. And finally, during step 26, a second capacitor plate structure 51 (as seen in FIG. 5) is formed over the first capacitor plate structure 31 such that second capacitor plate structure 51 spans at least a portion of first capacitor plate structure 31. The completed structure forms a storage capacitor 52 that serves as an effective storage capacitor for a storage cell to a memory device, such as a Dynamic Random Access Memory (DRAM).

It is to be understood that in FIG. 5, dielectric layer 50 represents either a single MOCVD nitride layer (such as layer 41 of FIG. 4) or dielectric layer 50 may represent any combination of dielectric layers depicted in FIG. 4a, including RTN nitride layer 40, MOCVD nitride layer 41, CVD nitride layer 42 and silicon dioxide layer 43.

During the formation of the RTN nitride layer 40, it is preferred that the temperature is generated by radiant energy having a wavelength in the approximate range of 0.2 to 1.6 mm and that the radiant energy comprises photon energy in the absorption band of silicon. For example, excellent temperature generation means include a Tungsten Halogen lamp or a Ultra-Violet lamp.

It is to be understood that although the present invention has been described with reference to a preferred embodiment, various modifications, known to those skilled in the art, may be made to the process steps presented herein without departing from the invention as recited in the several claims appended hereto. For example, all temperature ranges and time period ranges listed are not intended to be limited to the stated ranges but are instead intended to include all temperatures and times assumed therein, as well as all temperatures ranges and times period ranges assumed therein. Also, the capacitive dielectric material of the present invention may be used in any capacitive type device and in particular in storage capacitors used in memory devices or in storage elements used in floating gate devices.

What is claimed is:

1. A method using Metal Organic Chemical Vapor Deposition (MOCVD) for forming a silicon nitride film during semiconductor device fabrication, said method comprising the steps of:

while in a Rapid Thermal Processing (RTP) chamber, forming a first nitride layer superjacent a structure;

while in an MOCVD chamber, exposing said structure to a gas vapor phase of an organometallic precursor and to a nitrogen based gas, said structure having an aspect ratio comprising a vertical component and a horizontal component; wherein the vertical component of said structure is greater in dimension than the horizontal component of said structure.

2. The method of claim 1, wherein said structure has a roughened silicon surface.

3. The method of claim 1, wherein a ratio of said gas vapor phase of organometallic precursor to said nitrogen based gas is at least 3:1.

4. The method of claim 1, wherein said gas vapor phase of an organometallic precursor is generated by bubbling an inert gas into said organometallic precursor.

5. The method of claim 1, wherein said organometallic precursor comprises a silane based organometallic precursor.

6. The method of claim 5, wherein said silane based organometallic precursor comprises diethylsilane.

7. The method of claim 1, wherein said nitrogen based gas comprises nitrogen gas vapor generated from an organometallic precursor containing a nitrogen species.

8. The method of claim 7, wherein said nitrogen gas vapor is generated by bubbling an inert gas into said organometallic precursor containing a nitrogen species.

9. The method of claim 1, wherein said nitrogen based gas comprises at least one of $NH_3$ or hydrazine.

10. The method of claim 1, wherein said aspect ratio ranges from 2:1 to 10:1.

11. The method of claim 1, wherein said silicon nitride film has a thickness of at least 20 Å.

12. The method of claim 11, wherein said silicon nitride film has a thickness ranging from 40 Å to 70 Å.

13. The method of claim 11, wherein said silicon nitride film has a thickness ranging from 700 Å to 2500 Å.

14. The method of claim 1, wherein said MOCVD is performed in a single wafer deposition system.

15. The method of claim 1, wherein said MOCVD is performed in a batch wafer deposition system.

16. The method of claim 1, wherein said step of forming a first nitride layer further comprises introducing $NH_3$ into said RTP chamber while heating said structure in-situ to a temperature of at least 900° C. continuously for approximately 10 to 60 seconds, at a vacuum pressure range of $10^{-10}$ Torr to atmospheric pressure.

17. The method according to claim 1, further comprising the step of:

depositing a second nitride layer superjacent said first nitride layer.

18. The method according to claim 17, further comprising the step of:

forming a silicon dioxide layer superjacent said second nitride layer.

19. The method according to claim 17, wherein said depositing of a second nitride layer comprises low pressure chemical gas vapor deposition.

20. The method according to claim 17, wherein said depositing of a third nitride layer comprises plasma nitridation.

21. The method according to claim 16, wherein said temperature is generated by radiant energy having a wavelength in the approximate range of 0.2 to 1.6 mm.

22. The method according to claim 21, wherein said radiant energy comprises photon energy in the absorption band of silicon.

23. The method according to claim 16, wherein said temperature is generated by means of a Tungsten Halogen lamp.

24. The method according to claim 16, wherein said temperature is generated by means of a Ultra-Violet lamp.

25. A method for forming a nitride dielectric film during semiconductor device fabrication, said method comprising the steps of:

providing a semiconductive substrate in a rapid thermal processing chamber, said semiconductive substrate comprising a structure having an aspect ratio comprising a vertical component and a horizontal component; wherein the vertical component of said structure is greater in dimension than the horizontal component of said structure;

forming a first nitride layer supported by said semiconductive substrate; and depositing a second nitride layer superjacent said first nitride layer inside an (MOCVD) chamber, by exposing said first nitride layer to a gas vapor phase of an organometallic precursor and to a nitrogen based gas.

26. A method for forming a nitride dielectric film during semiconductor device fabrication, said method comprising the steps of:

providing a silicon substrate in a rapid thermal processing chamber, said silicon substrate comprising a polysilicon material which forms a structure having an aspect ratio comprising a vertical component and a horizontal component; wherein the vertical component of said structure is greater in dimension than the horizontal component of said structure;

forming a first nitride layer superjacent said polysilicon material; and depositing a second nitride layer superjacent said first nitride layer inside an (MOCVD) chamber, by exposing said first nitride layer to a gas vapor phase of an organometallic precursor and to a nitrogen based gas.

* * * * *